United States Patent
Danzeisen et al.

[11] Patent Number: 5,942,903
[45] Date of Patent: Aug. 24, 1999

[54] APPARATUS FOR EMC TESTING OF ELECTRICAL DEVICES

[75] Inventors: Klaus Danzeisen, Graefelfing; Klaus-Dieter Goepel, Munich; Werner Schmidt, Chemnitz, all of Germany

[73] Assignee: Rohde & Schwarz GmbH & Co. KG, Munich, Germany

[21] Appl. No.: 08/754,153

[22] Filed: Nov. 22, 1996

[30] Foreign Application Priority Data

Dec. 29, 1995 [DE] Germany .................. 195 49 134

[51] Int. Cl.⁶ ........................................... G01R 31/00
[52] U.S. Cl. .................. 324/627; 324/628; 324/632; 333/4; 333/5; 333/26
[58] Field of Search ............ 333/5, 4, 26; 324/627, 324/628, 632

[56] References Cited

U.S. PATENT DOCUMENTS

| | | | |
|---|---|---|---|
| 2,446,195 | 8/1948 | Shive | 324/627 |
| 5,237,283 | 8/1993 | Carbonini | 324/627 |
| 5,285,164 | 2/1994 | Wong | 324/627 |
| 5,436,603 | 7/1995 | Fischer | 324/627 |

FOREIGN PATENT DOCUMENTS

| | | |
|---|---|---|
| 0517992 A1 | 12/1992 | European Pat. Off. . |
| 31 30 487 C2 | 2/1983 | Germany . |
| 37 31 165 C2 | 3/1989 | Germany . |
| 39 31 449 C2 | 3/1990 | Germany . |
| 38 42 196 C2 | 6/1990 | Germany . |
| 39 25 247 C2 | 1/1991 | Germany . |
| 43 00 778 A1 | 7/1994 | Germany . |

OTHER PUBLICATIONS

Eighth International Conference on Electromagnetic Compatibility, Sep. 21–24, 1992, organized by the Electronics Division of the Institution of Electrical Engineers; L. Carbonini, A Shielded Multi–Wire Transmission Line for Susceptibility Measurements with Horizontally Polarized Electric Field, pp. 33–38.

IEEE Transactions on Instrumentation and Measurement, vol. IM–26, No. 3, Sep. 1977, M. L. Crawford et al, Generation of EM Susceptibility Test Fields Using a Large Absorber–Loaded TEM Cell, pp. 225–230.

Technische Mitteilungen des RFZ—28, vol. 1, Jan. 1994, Werner Wunderlich et al, Störfestgkeitsmessungen an Einrichtungen zur Drahtlosen Nachrichtenübertragung mit Relativ Grossen Abmessuugen, pp. 20–23.

COMTEST G–STRIP— RF Test Systems for Global EMC Standard—Thermo Voltek, a Thermo Electron Company, (Jan. 1995), pp. 1–6.

Primary Examiner—Josie Ballato
Assistant Examiner—Jose M. Solis
Attorney, Agent, or Firm—Hill & Simpson

[57] ABSTRACT

In an apparatus for EMC testing of electrical devices, conductors are arranged at opposite sides of a chamber of conductive material at a spacing from and parallel to the chamber walls. These conductors form a symmetrical double line and are fed out of phase at one end by a radio frequency source. They are electrically connected to the chamber walls at the other end via terminating impedances.

17 Claims, 1 Drawing Sheet

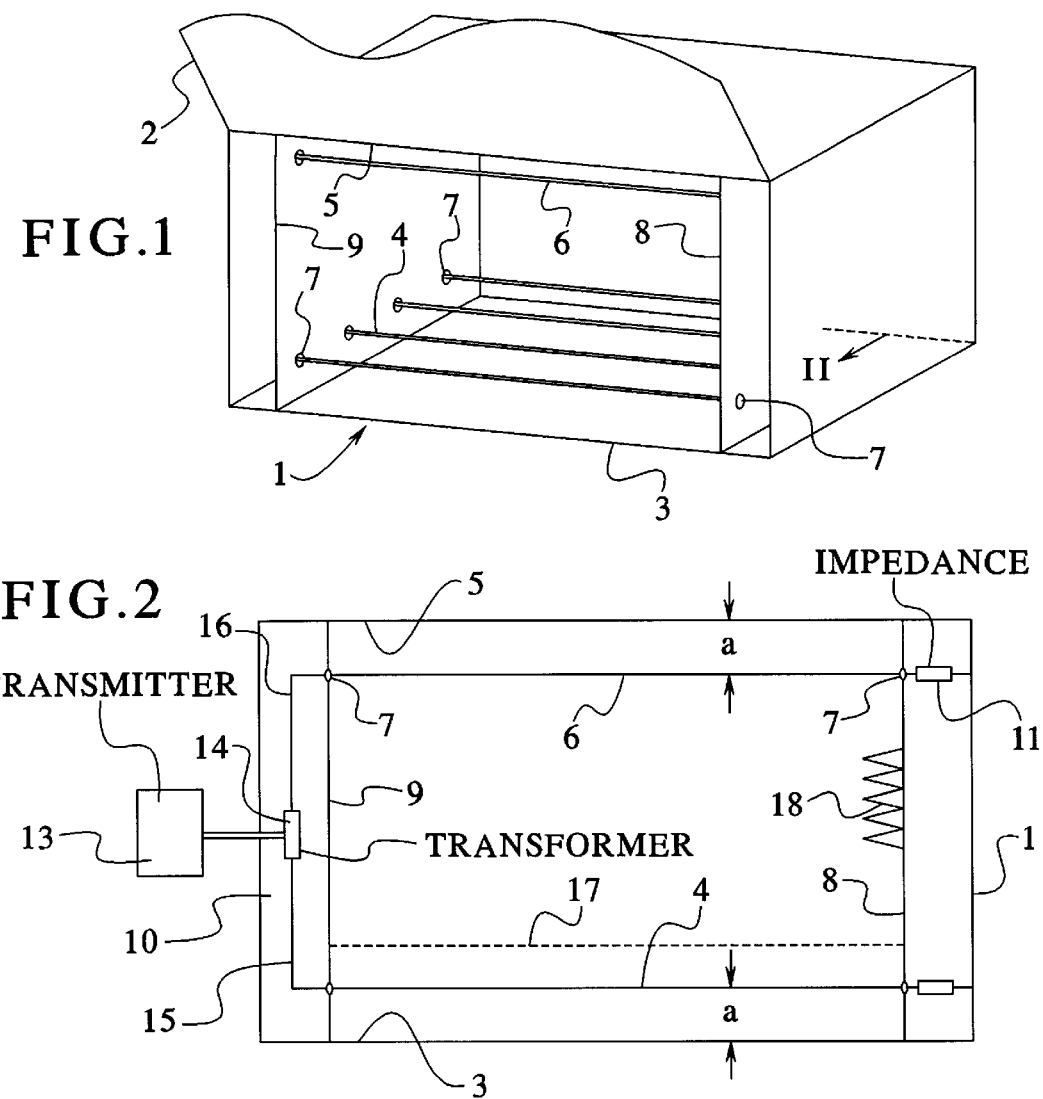
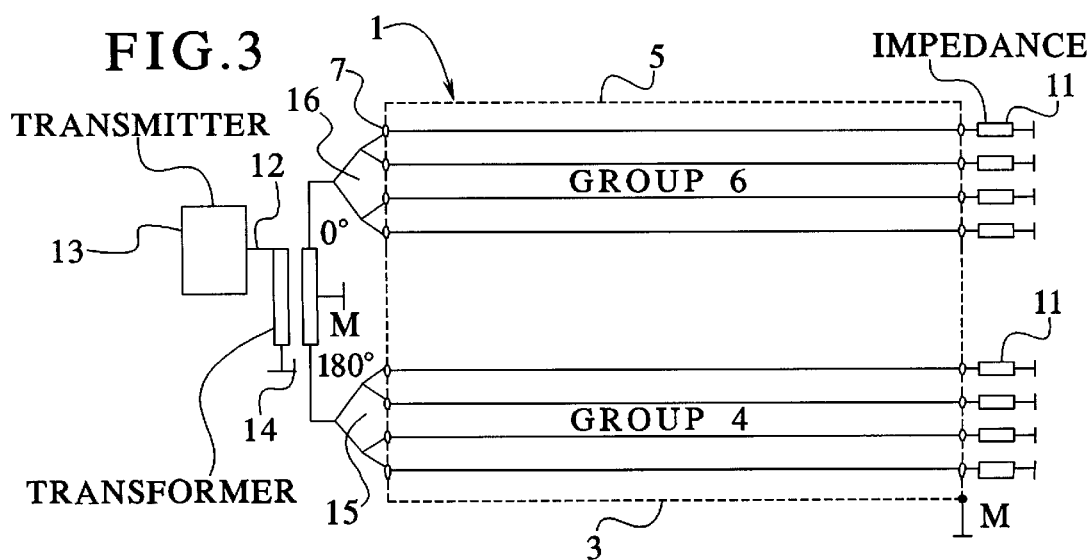

APPARATUS FOR EMC TESTING OF ELECTRICAL DEVICES

BACKGROUND OF THE INVENTION

The present invention is directed to and proceeds from an apparatus for the EMC testing of electrical devices.

In prior art apparatus for EMC (electromagnetic compatibility) or, respectively, EMI (electromagnetic interference) measurement the electromagnetic field in the chamber was generated exclusively by an asymmetrical excitation system. The metallic chamber forms the outer conductor and a metal plate, insulated in the chamber, forms the inner conductor of a coaxial line system that is asymmetrically supplied from a radio frequency source (see Patent references DE 39 31 449, DE 31 30 487, DE 39 25 247, DE 37 31 165, DE 43 00 778, EP 0 517 992; also see Wunderlich, Werner, Störfestigkeitsmessungen an Einrichtungen zur drahtlosen Nachrichtenübertragung mit relativ grossen Abmessungen, Technische Mitteilungen des RFZ, Vol.28, No.1, 1984, pp.220 ff.; also see Crawford, M. L., Workman, J. L., Thomas, C. L., "Generation of EM susceptibility Test Fields Using a Large Absorber-Loaded TEM Cell", IEEE Transactions on Instrumentation and Measurement, September 1977, No.3, pages 225 ff.). In order to achieve a uniform field strength distribution in the chamber as required by the EMC norm (the norm requires that the change in field strength in the testing chamber is less than 6 Db), the inner conductor plate on which the unit under test is placed must be arranged in the middle of the chamber insofar as possible. A result, however, only half the space of the chamber is available for the acceptance of the unit under test. Moreover, the EMC testing apparatus that meet the norm are very bulky since a pyramidal chamber design is required for the transition from the coaxial feeder cable to the system of inner conductor and outer conductor that generates the field.

It has been attempted to arrange the inner conductor as close as possible to the lower bottom wall of a quadratic chamber (G-STRIP cell Comtest of the Thermo Voltek company, Great Britain). With this approach the usable space for the acceptance of the unit under test is enlarged, but this known cell does not meet the strict norm for the uniform field distribution in the chamber.

SUMMARY OF THE INVENTION

It is an object of the present invention to create an EMC testing apparatus that, given minimal space requirements, offers the largest possible, usable testing space and nonetheless guarantees the uniform field strength distribution in the chamber required by the standard.

In general terms the present invention is an apparatus fro EMC testing of electrical devices. The apparatus has a chamber of conductive material and a means for generating an electromagnetic radio frequency field within the chamber that is supplied via a radio frequency source. At least two conductors are arranged at opposite sides of the chamber at a predetermined spacing from and parallel to the chamber walls. The conductors form a symmetrical double line and are fed with a 180° phase shift end by the radio frequency source. The other end of the double line is electrically connected to the chamber walls via terminating impedances.

Advantageous developments of the present invention are as follows.

The terminating impedances are dimensioned such that they correspond to the characteristic impedance formed between the chamber walls and the conductors. A plurality of conductors supplied with a 180° phase shift are respectively arranged next to one another at each side of the chamber at the predetermined spacing from and parallel to the chamber wall.

The mutual spacings of the conductors and/or terminating impedances are dimensioned differently to effect a predetermined field strength distribution. Radio frequency absorbers are attached to the inside of at least one side wall of the chamber.

In the inventive apparatus, the electromagnetic field in the chamber is generated by a double line (Lecher line) supplied symmetrically to ground (chamber housing) whose conductors, are arranged at a relatively large mutual spacing formed by the height of the chamber, and yet are arranged at a relatively small distance from the respectively neighboring chamber walls. Due to the proximity of the chamber walls, an electromagnetic field is built up outside the double line, that is, between the conductors and the chamber wall. This line system formed between each conductor and the neighboring metallic chamber wall can be viewed as being an asymmetrical, open stripline (microstrip). The characteristic impedance for this stripline system can be calculated according to the known dimensioning thereof (spacing of the conductor from the chamber wall, diameter or, respectively, width of the conductor and, potentially, dielectric present between conductor and chamber wall). The value of the terminating impedance between the conductor and the chamber wall is being determined by this. A relatively high-impedance double line system is thus used for the feed as a consequence of the large spacing. The field strength concentration in the space between the conductor and the chamber wall is not utilized for the EMC measurement but only the electromagnetic field in the space between the two oppositely residing conductors of the double line system that is available with the uniform distribution for the test as required according to the standard. In a practical exemplary embodiment, the change of the electromagnetic field in the entire chamber is only ±3 dB. Nonetheless, nearly the entire interior of the chamber is available for the acceptance of units under test, and an inventive apparatus can be manufactured with minimal overall outside dimensions.

In the simplest case, the double line system is formed by only two individual conductors lying opposite one another. According to a development of the present invention, however, it has proven advantageous to provide a plurality of conductors arranged next to one another at each side, these being respectively supplied in-phase at one side of the chamber and thus also assuring a uniform field distribution over the entire chamber wall. These individual conductors arranged next to one another are preferably arranged parallel to one another, which, however, is not compulsory. For example, they could also be distributed fan-like over the chamber wall proceeding from a central feed point.

Given a plurality of conductors arranged next to one another, each is terminated to ground (chamber wall) via a separate terminating impedance. The sum of all of these terminating impedances of the double line corresponds to the characteristic impedance of the stripline system. In this way, the double line no longer has the relatively high characteristic impedance that would form in free space given a standard double line but is defined by the significantly lower characteristic impedance of the stripline systems. A more beneficial, low-impedance feed at the input side is thus also possible. On the basis of different dimensioning of the terminating impedances of the individual conductors arranged next to one another, it is also possible to generate a desired, specific field distribution within the chamber. In this way, for example, an optimization of the field distribution can be achieved in the corners of the chamber on the basis of corresponding dimensioning of the terminating impedances effective thereat. The same is possible on the basis of a differing selection of the mutual spacings of the conductors per conductor group. Instead of respectively separate terminating impedances for the individual conductors arranged next to one another, these could also be combined in one point at the terminating end (as in the case of the feed at the input side) via lines of identical length and could be connected to ground via a common terminating impedance.

In order to avoid disturbing reflections, particularly in the higher frequency range, appropriate RF absorbers can also be additionally attached on the inside walls of the chamber, for example at the end faces between which the conductors of the double line are arranged.

In general, it suffices for a uniform field distribution to only arrange the conductors of a double line at two chamber walls lying opposite one another. For specific applications, however, it can also be expedient to respectively attach such double line systems to three or four sides of the chamber, that is, for example, a first double line system at the floor and ceiling of the chamber and a second double line system at the sidewalls lying opposite one another.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 is a perspective view of the EMC testing cell of the present invention;

FIG. 2 is a cross-sectional view of the FIG. 1 testing cell; and

FIG. 3 is a schematic depicting the present invention.

DESCRIPTION OF THE PREFERRED EMBODIMENTS

In perspective, FIG. 1 shows the overall view of an inventive EMC testing cell with a cuboid chamber 1 of sheet metal having a side length of, for example, 1 to 2 meters for the acceptance of an electrical device (not shown) whose electromagnetic sensitivity is to be measured according to the EMC norm. The one sidewall of the chamber 1 is fashioned as a trap door 2. A plurality of conductors 4, four conductors 4 in the exemplary embodiment, are arranged at the chamber floor at the spacing 'a' from and parallel to the inside bottom wall 3, and a plurality of conductors 6 are arranged at the chamber ceiling in the same way at the spacing 'a' from and parallel to the inside 5 of the ceiling, as the sectional view in FIG. 2 shows. For example, the conductors 4,6 are fashioned as wires that stretch between bushings 7 of insulating material that are secured to end-face partitions 8,9 of the chamber. If necessary, additional insulating supports can also be arranged between the chamber walls 3,5 and the conductors 4,6. As the schematic circuit diagram according to FIG. 3 shows, the conductors 4,6 are supplied with a mutual 180° phase shift at one end via a feeder arrangement and their other end is respectively connected to the metallic chamber walls (ground M) via a terminating impedance 11. The feeder arrangement 10 is connected, for example via a coaxial cable 12, to a radio frequency transmitter 13 via which an electromagnetic field with a frequency between, for example, 80 MHZ and GHz can be generated in the chamber. The radio frequency power asymmetrically supplied via the coaxial cable 12 is symmetrized to ground M via a balance-to-unbalance transformer 14 in the feeder arrangement 10 and is then supplied to the individual conductors 4 or, respectively, 6 via a distributer circuit 15 or, respectively, 16 with distributor lines of identical length. Electrically, the two conductor groups 4,6 lying opposite one another form a symmetrical double line that is supplied anti-phase and symmetrically to ground M (chamber 1) from the balance-to-unbalance transformer 14. At the same time, each conductor group 4 or, respectively, 6 forms an asymmetrical line system with the chamber wall 3 or, respectively, 5 lying opposite it whose characteristic impedance is essentially defined by the spacing 'a' of the conductors from the chamber wall. The terminating impedances 11 are dimensioned according to this characteristic impedance of the asymmetrical line system. As a result of the relatively large mutual spacing (determined by the size of the chamber), the characteristic impedance of the double line 4,6 is relatively high, on the order of several kilo-ohms whereas the characteristic impedance of the asymmetrical lines systems 3,4 or, respectively, 5,6 have an order of magnitude of 50 through 200 ohms Due to the functional interaction of this symmetrical feed system with the asymmetrical line systems, the double line is terminated with relatively low-impedance terminating impedances (characteristic impedance of the stripline), and the relatively high-impedance characteristic impedance of the double line lying parallel thereto can be left out of consideration in the dimensioning of the termination. At the input side, the terminating impedances corresponding to the characteristic impedance of the stripline act in series and form an input resistance that also has a relatively low-impedance and that is beneficial for the feed. The extremely uniform field strength distribution within the chamber is to be attributed to this combinatory effect.

The terminating impedances 11 are preferably arranged in the space between the end-face partition 8 and the end face of the chamber 1. The feeder arrangement 10 is preferably arranged in the space between the end-face partition 9 and the chamber wall at the opposite side. A schematically indicated false floor 17 for placing the units under test is also preferably provided above the conductor group 4.

In order to be able to avoid disturbing reflections, particularly in the higher frequency range, additional RF absorbers 18 can also be attached to the inside of the chamber walls, as schematically shown at the end face partition 8. In the same way, corresponding absorbers can also be attached to the end wall 9 at the feed side and, potentially, to the sidewalls as well.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An apparatus for EMC testing of electrical devices, comprising:

a chamber of conductive material, said chamber having chamber walls;

a generator for generating an electromagnetic radio frequency field within the chamber that is supplied via a radio frequency source;

at least two conductors arranged at opposite sides of the chamber at a predetermined spacing from and parallel to respectively adjacent chamber walls;

said conductors forming a symmetrical double line and being fed with a 180° phase shift at a first end of the double line by the radio frequency source; and terminating impedances that electrically connect a second end of the double line to the respective chamber walls.

2. The apparatus according to claim 1, wherein the terminating impedances are dimensioned such that the terminating impedance correspond to the characteristic impedance formed between the respective chamber walls and the conductors.

3. The apparatus according to claim 1, wherein a plurality of conductors are respectively arranged next to one another at each side of the chamber at a predetermined spacing from and parallel to the reflective chamber walls.

4. An apparatus for EMC testing of electrical devices, comprising:

a chamber of conductive material with an electromagnetic radio frequency field within the chamber;

the chamber having chamber walls;

at least two conductors respectively arranged at opposed respective chamber walls of the chamber at a predetermined spacing from and parallel to the respective chamber walls;

said conductors forming a symmetrical double line and being fed out of phase at a first end of the double line by the radio frequency source; and terminating impedances electrically connected between the respective chamber walls and a second end of the double line.

5. The apparatus according to claim 1, wherein the apparatus further comprises radio frequency absorbers that are attached to an inside of at least one side chamber wall of the chamber walls of the chamber, the at least one side chamber wall being different from said reflective chamber walls.

6. An apparatus for EMC testing of electrical devices, comprising:

a chamber of conductive material with an electromagnetic radio frequency field within the chamber;

the chamber having chamber walls;

a plurality of conductors respectively arranged next to one another at opposed sides of the chamber at a predetermined spacing from and parallel to respectively adjacent chamber walls;

said conductors forming a symmetrical double line and being fed out of phase at a first end of the double line by the radio frequency source;

terminating impedances electrically connected between the respective chamber walls and a second end of the double line.

7. The apparatus according to claim 4, wherein the terminating impedances are dimensioned such that the terminating impedance correspond to the characteristic impedance formed between the respective chamber walls and the conductors.

8. Apparatus according to claim 4, wherein a plurality of conductors are respectively arranged next to one another at each side of the chamber at a predetermined spacing from and parallel to the reflective chamber walls.

9. Apparatus according to claim 6, wherein the terminating impedances are dimensioned such that the terminating impedance correspond to the characteristic impedance formed between the respective chamber walls and the conductors.

10. Apparatus according to claim 4, wherein the apparatus further comprises radio frequency absorbers that are attached to an inside of at least one side chamber wall of the chamber walls of the chamber, the at least one side chamber wall being different from said reflective chamber walls.

11. Apparatus according to claim 6, wherein the apparatus further comprises radio frequency absorbers that are attached to an inside of at least one side chamber wall of the chamber walls of the chamber, the at least one side chamber wall being different from said reflective chamber walls.

12. An apparatus for EMC testing of electrical devices, comprising:

a chamber of conductive material, said chamber having chamber walls;

a generator for generating an electromagnetic radio frequency field within the chamber that is supplied via a radio frequency source;

at least two conductors arranged at opposite sides of the chamber at a predetermined spacing from and parallel to respectively adjacent chamber walls;

said conductors forming a symmetrical double line and being fed anti-phase and symmetrically to the chamber at a first end of the double line by the radio frequency source via a transformer; and said conductors having opposite ends electrically connected to the chamber via terminating impedances, each conductor forming an asymmetrical line with an adjacent chamber wall.

13. The apparatus according to claim 12, wherein the terminating impedances are dimensioned such that the terminating impedance correspond to the characteristic impedance formed between the respective chamber walls and the conductors.

14. The apparatus according to claim 12, wherein a plurality of conductors are respectively arranged next to one another at each side of the chamber at a predetermined spacing from and parallel to respective chamber walls, which are fed in phase.

15. The apparatus according to claim 12, wherein mutual spacings of the conductors and/or terminating impedances are dimensioned differently to effect a predetermined field strength distribution.

16. The apparatus according to claim 12, wherein the apparatus further comprises radio frequency absorbers that are attached to an inside of at least one side chamber wall of the chamber walls of the chamber.

17. The apparatus according to claim 12, wherein the apparatus further comprises connecting lines between said transformer and said conductors, the connecting lines being arranged in a small region of the chamber.

* * * * *